United States Patent
Chaintreuil et al.

(10) Patent No.: US 10,892,702 B2
(45) Date of Patent: Jan. 12, 2021

(54) FUNCTIONALIZED INFRASTRUCTURE AND METHOD FOR INSTALLING SUCH A FUNCTIONALIZED INFRASTRUCTURE

(71) Applicants: Commissariat a l'energie atomique et aux energies alternatives, Paris (FR); COLAS, Paris (FR)

(72) Inventors: Nicolas Chaintreuil, Montmelian (FR); Franck Barruel, Le Bourget du Lac (FR)

(73) Assignees: Commissariat a l'energie atomique et aux energies alternatives, Paris (FR); COLAS, Paris (FR)

( * ) Notice: Subject to any disclaimer, the term of this patent is extended or adjusted under 35 U.S.C. 154(b) by 69 days.

(21) Appl. No.: 16/215,940

(22) Filed: Dec. 11, 2018

(65) Prior Publication Data
US 2019/0181794 A1    Jun. 13, 2019

(30) Foreign Application Priority Data
Dec. 13, 2017    (FR) .................................. 17 62050

(51) Int. Cl.
*H02S 20/21*    (2014.01)
*H02S 40/32*    (2014.01)
(Continued)

(52) U.S. Cl.
CPC ............ *H02S 20/21* (2014.12); *H01L 31/042* (2013.01); *H01L 31/0481* (2013.01);
(Continued)

(58) Field of Classification Search
CPC .......... H02S 20/21; H02S 20/24; H02S 20/26; H02S 40/32; H02S 40/34; H02S 40/36
See application file for complete search history.

(56) References Cited

U.S. PATENT DOCUMENTS

2004/0031219 A1* 2/2004 Banister .................. H02S 40/32
52/220.2
2005/0199282 A1* 9/2005 Oleinick ............... H01L 31/048
136/256
(Continued)

FOREIGN PATENT DOCUMENTS

WO    WO-03066993 A1 *    8/2003    ........... H01L 31/048

OTHER PUBLICATIONS

French Preliminary Search Report dated Jun. 18, 2018 in French Application 17 62050, filed on Dec. 13, 2017 (with English Translation of Categories of Cited Documents & Written Opinion).
(Continued)

*Primary Examiner* — Christine T Cajilig
(74) *Attorney, Agent, or Firm* — Oblon, McClelland, Maier & Neustadt, L.L.P.

(57) ABSTRACT

A functionalized infrastructure including a bottom layer including a zone to be covered, the infrastructure including: n covering slabs arranged juxtaposed in order to pave the surface to be covered, each covering slab having a rank i, with i ranging from 1 to n and n being greater than or equal to 2 and including a coverage surface positioned to cover a part of the zone and at least one electrical functionalization assembly, the n covering slabs including at least one covering slab of a first type having a coverage surface of a first form and a covering slab of a second type having a coverage surface of a second form, each covering slab including an electrical connection block arranged on the slab so as to separate each slab of rank i from a slab of rank i+1 by a pitch (P) that is constant.

16 Claims, 5 Drawing Sheets

(51) Int. Cl.
   *H02S 40/34* (2014.01)
   *H02S 40/36* (2014.01)
   *H01L 31/05* (2014.01)
   *H01L 31/048* (2014.01)
   *H01L 31/042* (2014.01)

(52) U.S. Cl.
   CPC .......... *H01L 31/0504* (2013.01); *H02S 40/32* (2014.12); *H02S 40/34* (2014.12); *H02S 40/36* (2014.12)

(56) References Cited

U.S. PATENT DOCUMENTS

| | | | | |
|---|---|---|---|---|
| 2011/0253188 | A1* | 10/2011 | Lenox | H01L 31/0504 136/244 |
| 2012/0187767 | A1* | 7/2012 | Kanno | H02J 50/20 307/82 |
| 2014/0366464 | A1* | 12/2014 | Rodrigues | F24S 25/61 52/173.3 |
| 2017/0085213 | A1* | 3/2017 | Petrin | H02S 40/36 |
| 2017/0207742 | A1* | 7/2017 | Roppelt | H02S 20/24 |
| 2017/0213925 | A1* | 7/2017 | Gaume | H01L 31/1876 |
| 2018/0102730 | A1* | 4/2018 | Brusaw | E01C 1/007 |
| 2020/0059049 | A1* | 2/2020 | Lynn | H01R 13/73 |

OTHER PUBLICATIONS

Gnatov, A., et al. "Smart Road as a Complex System of Electric Power Generation", 2017 IEEE First Ukraine Conference on Electrical and Computer Engineering (UKRCON), 2017, 5 pages.

\* cited by examiner

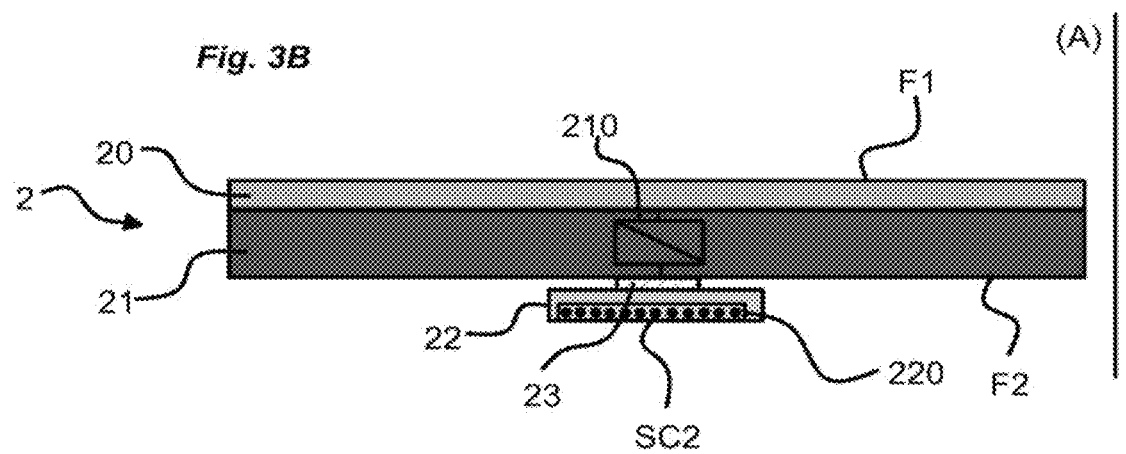
Fig. 3B
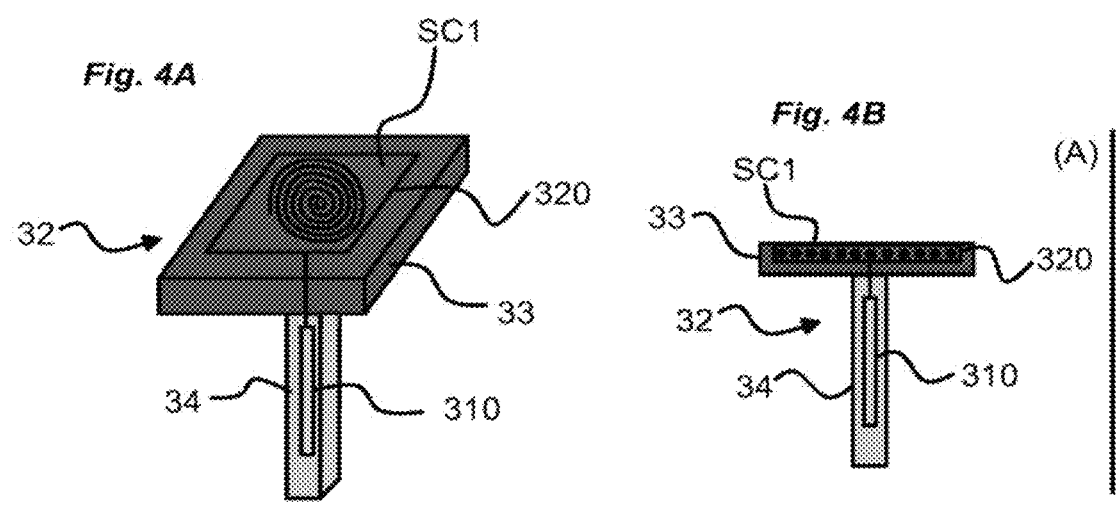
Fig. 4A
Fig. 4B

FUNCTIONALIZED INFRASTRUCTURE AND METHOD FOR INSTALLING SUCH A FUNCTIONALIZED INFRASTRUCTURE

TECHNICAL FIELD OF THE INVENTION

The present invention relates to a functionalized infrastructure and to a method for installing such a functionalized infrastructure.

The term "infrastructure" should be understood, in a nonlimiting manner, to be a roadway of road or motorway type, but also a wall or a roof.

The term "functionalized" should be understood, in a nonlimiting manner, to mean the provision of a function of electrical energy generator type through the use of photovoltaic cells, or of electrical energy receiver type.

It will therefore cover providing, through the infrastructure, one or more functions such as electrical energy generation through the use of photovoltaic cells, visual or audible signalling, lighting, but also vehicle counting or recharging the batteries of an electric vehicle.

STATE OF THE ART

To make space cost-effective, particularly in built-up areas, it has been proposed to produce roads which incorporate photovoltaic cells. Since the roads are often well exposed to the sun, they are able to easily pick up light energy. By incorporating photovoltaic cells in them, they can convert the light energy picked up into electrical energy. The electrical energy produced by the roads can then be employed in various ways. Converters are for example shrewdly positioned at the edges of the roads to return the electrical energy generated to the network or to any other installation.

The documents referenced FR3016257A1 and U.S. Pat. No. 8,080,901B2 describe such functionalized road solutions based on photovoltaic cells or energy converters of piezoelectric or thermoelectric type.

The documents WO2016/16165A1 and WO2016/16170A1, for their part, describe a multilayer structure of a photovoltaic module, which can be employed to produce the surface course of a functionalized roadway. This multilayer structure has in particular mechanical characteristics that are sufficient to absorb the shocks and undergo the various mechanical stresses of a surface course of a roadway.

However, even though the prospect of functionalizing the roads is particularly interesting, for the time being it comes up against implementation difficulties. The electrical connections often tend to wear through oxidation. In addition, once the infrastructure is installed, the maintenance and servicing thereof remain complicated, the slightest malfunction often requiring the road to be broken up to access the defective parts.

There is therefore, for the time being, no solution that makes it possible to produce a functionalized infrastructure which is reliable, inexpensive, easy to install and service.

The aim of the invention is to propose a solution for producing a functionalized infrastructure simply and inexpensively, which is easy to install and service in case of malfunction.

SUMMARY OF THE INVENTION

This aim is achieved by a functionalized infrastructure comprising a bottom layer comprising a zone to be covered, said infrastructure comprising:

n covering slabs, n being greater than or equal to 2, the n slabs each comprising a coverage surface for covering a part of said zone, the n slabs being arranged juxtaposed in order to pave said surface to be covered, each covering slab comprising at least one electrical functionalization assembly:

the n covering slabs comprising at least one covering slab of a first type having a coverage surface of a first form and a covering slab of a second type having a coverage surface of a second form, distinct from the first form, each covering slab comprising an electrical connection block, the electrical connection block of each slab being arranged on the slab so as to be separated from the electrical connection block of the adjacent slab by a pitch that is constant, whatever the form of each of their slabs.

The solution of the invention makes it possible to propose an infrastructure in which the slabs have a standard architecture whatever their form, allowing them to be adapted to the form of the surface to be covered. The position of the electrical connection block on the slab is thus chosen to ensure that it can always be separated from the electrical connection block of the adjacent slab by a constant pitch.

According to a particular feature, the constant pitch is defined by a cable length in a rectilinear direction defined between the slab of rank i and the slab of rank i+1.

According to a particular embodiment, said electrical connection block is arranged on each slab of rank i so as to generate a pitch that is constant in two right-angled directions.

According to another particular embodiment, said slab of first type has a coverage surface of square form.

According to another particular embodiment, the electrical connection block is positioned along one of the sides of the square formed by the coverage surface.

According to another particular embodiment, said slab of second type has a coverage surface having an isosceles right-angled triangle form, of which each small side has a length equal to that of a side of the square formed by the coverage surface of the slab of first type.

According to another particular embodiment, the electrical connection block is arranged along one or other of the two small sides of the isosceles right-angled triangle formed by the coverage surface of the slab of second type.

According to another particular embodiment, the infrastructure comprises a connecting cable arranged to connect the electrical connection block of each slab of rank i to the electrical connection block of the slab of rank i+1, said cable being of a length defining said constant pitch.

According to another particular embodiment, each slab comprises a contactless energy transmission block connected to said electrical connection block.

According to another particular embodiment, the infrastructure comprises a contactless energy transmission system comprising a first part having n contactless energy transmission blocks and a second part formed by said n slabs, each contactless energy transmission block of the first part being positioned to be inductively coupled with a distinct corresponding contactless energy transmission block of the first part.

According to another particular embodiment, the infrastructure comprises at least one connecting cable arranged to connect each contactless energy transmission block of the first part to an adjacent contactless energy transmission block of the first part, said connecting cable having a length corresponding to said constant pitch.

According to another particular embodiment, each slab comprises an electrical functionalization assembly of electrical energy generator type or of electrical energy receiver type.

The invention relates also to a method for installing a functionalized infrastructure comprising a bottom layer comprising a zone to be covered, said method consisting in:
covering said zone with n covering slabs arranged juxtaposed in order to pave said surface to be covered, each covering slab comprising a coverage surface positioned to cover a part of said zone and at least one electrical functionalization assembly,
the n covering slabs comprising at least one covering slab of a first type having a coverage surface of a first form and a covering slab of a second type having a coverage surface of a second form, distinct from the first form,
each covering slab comprising an electrical connection block,
the electrical connection block of each slab being arranged on the slab so as to be separated from the electrical connection block of the adjacent slab by a pitch that is constant, whatever the form of each of their slabs.

According to a particular embodiment, said covering slab of first type has a coverage surface of square form.

According to another particular embodiment, said covering slab of second type has a coverage surface having an isosceles right-angled triangle form, of which each small side has a length equal to that of a side of the square formed by the coverage surface of the slab of first type.

According to another particular embodiment, the method consists in employing a connecting cable arranged to connect the electrical connection block of each slab of rank i to the electrical connection block of the slab of rank i+1, said cable being of a length defining said constant pitch.

According to another particular embodiment, the method consists in implementing a contactless energy transmission system between a first part having n contactless energy transmission blocks and a second part formed by said n covering slabs, each contactless energy transmission block of the first part being positioned to be inductively coupled with a distinct corresponding contactless energy transmission block of the first part and it consists in employing at least one connecting cable arranged to connect each contactless energy transmission block of the first part to an adjacent contactless energy transmission block of the first part, said connecting cable having a length corresponding to said constant pitch.

BRIEF DESCRIPTION OF THE FIGURES

Other features and advantages will emerge from the following detailed description given in light of the attached drawings listed below:

FIGS. 3A and 3B represent, seen in transverse cross section, a slab employed in the functionalized infrastructure of the invention, according to two distinct configurations.

FIGS. 4A and 4B represent, respectively seen in perspective and seen in transverse cross section, a contactless energy transmission block employed in a contactless energy transmission system.

DETAILED DESCRIPTION OF AT LEAST ONE EMBODIMENT

Hereinafter in the description, the terms "top", "bottom", "high", "low" or other equivalent terms are to be considered according to an axis (A) which will be defined as perpendicular to the plane formed by a slab (vertical axis in the plane of the sheet in the attached figures).

As described above, infrastructure should be understood to mean, for example, a zone that can carry traffic.

A "zone that can carry traffic" should be understood to mean, in a nonlimiting manner, any zone provided for the circulation of pedestrians and/or vehicles, such as, for example, a roadway of road or motorway type, a cycle track, a pavement or a car park.

Account will be taken of the fact that the infrastructure 1 to be functionalized comprises a bottom layer 10, provided with a surface 100 to be covered with a functional layer which allows said infrastructure 1 to be functionalized.

The invention aims in particular to produce said functional layer by employing covering slabs positioned appropriately, for example so as to be adjacent and contiguous, to at least partially cover the surface 100 of the bottom layer 10 of said infrastructure 1.

In the case of an infrastructure of the type of a zone that can carry traffic, the bottom layer will for example be composed of a coating. Obviously, since this bottom layer does not form part of the invention, any other single-layer or multilayer structure will be able to be considered.

Figure 1:
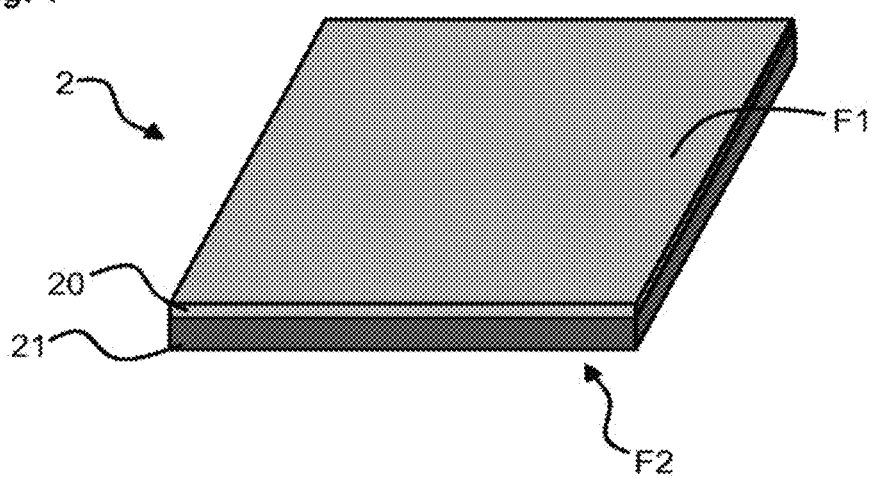
FIG. 1 schematically represents, in perspective, a covering slab employed in an infrastructure of the invention.

Referring to FIG. 1, a covering slab 2 employed in the invention comprises the features described below.

The slab 2 of the invention can have the form of a single-piece element, that is to say forming only a single part. It advantageously has a first face, called top face F1, intended to form the outer face of the infrastructure, and a bottom face F2 that is opposite and preferably parallel to the top face. Between its two faces, the slab comprises several functional assemblies or blocks. These functional assemblies and blocks will be housed preferentially in one or more hermetic housings fixed together and having, if necessary, electrical connection means. Its top face F1 is advantageously flat. It will be seen hereinbelow that this outer layer, defining the outline of the slab, will be able to be of different forms.

The covering slab 2 thus comprises an electrical functionalization assembly 20 which makes it possible to give the slab exclusively an electrical function of electrical energy generator type or of electrical energy receiver type (that is to say electrical energy consumer type). The infrastructure comprising several slabs of this type will, for its part, be able to be provided with one or more functions, depending on the type of slabs employed.

In a nonlimiting manner, this electrical functionalization assembly 20 of the slab comprises a first layer 200 having a top face also called outer face, forming the top face F1 of the slab 2 described above, and intended to represent the surface course of the zone that can carry traffic.

The covering slab 2 comprises an electronic block 21 connected to the electrical functionalization assembly 20 and which comprises at least one converter 210.

According to the invention, the electrical functionalization assembly 20 will be able to have different configurations depending on the functionality to be provided to the slab and to the infrastructure 1. It should be noted that the electronic block 21 will preferentially always be identical whatever the configuration of the electrical functionalization assembly 20.

Figure 2:
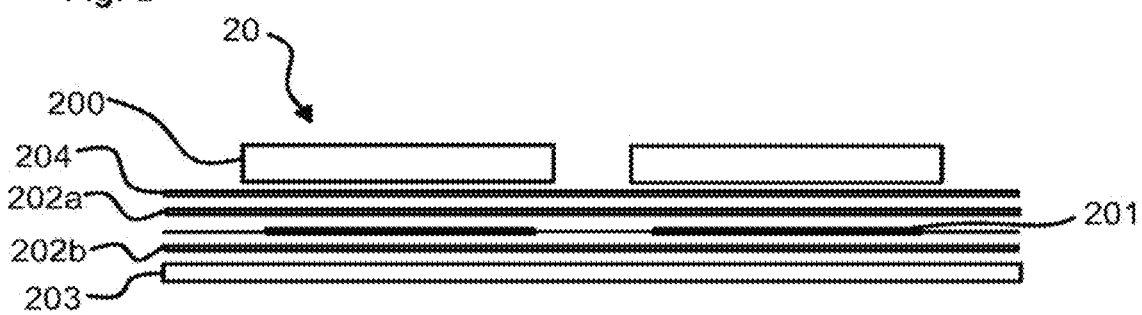
FIG. 2 represents, in transverse cross section, the different layers of an electrical functionalization assembly of the slab of photovoltaic module type.

In a first configuration of receiver type, the electrical functionalization assembly 20 takes the form of a photovoltaic module. Preferably, it comprises the structure described in the two patent applications WO2016/16165A1 and WO2016/16170A1 and represented in FIG. 2. Without going into details, in this photovoltaic module structure, the first layer 200 described above is transparent over all its thickness so as to allow a light flux to pass.

The term "transparent" is understood to mean that the material forming the first layer is at least partially transparent to visible light.

The first layer 200 will for example be produced in the form of a single plate or several juxtaposed plates. It will for example be produced in a transparent polymer material, such as, for example, polymethyl methacrylate (PMMA).

Moreover, the photovoltaic module comprises a plurality of photovoltaic cells 201 connected to one another in series or in series/parallel. As is known, the latter are intended to pick up the light flux which passes through the first layer.

The photovoltaic module comprises an encapsulating assembly in which the photovoltaic cells are encapsulated. This encapsulating assembly is preferentially composed of two layers 202a, 202b of encapsulation material, between which the photovoltaic cells are encapsulated. A laminating operation is applied to melt the two encapsulation layers 202a, 202b into a single layer in which the photovoltaic cells 201 are embedded. The production method is detailed in the two abovementioned patent applications. Since the latter does not form part of the invention, it is not described specifically in the present application.

The term "encapsulating" or "encapsulated" employed should be understood to mean that the photovoltaic cells 201 are housed in a volume, preferentially hermetic, formed by the assembling of the two layers of the assembly.

The photovoltaic module comprises a second layer 203, forming the rear face of the module. The encapsulating assembly is positioned between the first layer 200 and this second layer 203. This second layer 203 will for example be produced in a material of composite type, for example of polymer/glass fibre type.

The photovoltaic module advantageously comprises a so-called "damping" intermediate layer 204 situated between the first layer 200 and the top layer 202a of the encapsulating assembly (202a, 202b) and allowing the assembling, particularly by bonding, of the first layer 200 on the encapsulating assembly.

The photovoltaic module advantageously comprises an adhesive layer (not represented) situated between the encapsulating assembly and the second layer 203. This layer will be used in the assembling, particularly by bonding, of the second layer 203 on the encapsulating assembly.

In other configurations, the electrical functionalization assembly will be able to comprise exclusively an electrical energy receiver circuit.

In a second configuration, the electrical functionalization assembly 20 can in fact comprise a light- and/or sound-signalling electronic circuit.

The light-signalling electronic circuit comprises, for example, one or more light-emitting diodes making it possible to provide lighting.

In this second configuration, the structure of the electrical functionalization assembly 20 is similar to that of the first configuration. The differences lie in the fact that it employs a signalling block including light-emitting diodes.

In a third configuration, the electrical functionalization assembly can comprise an induction-electric vehicle recharging module. This solution makes it possible to recharge an electric vehicle when the latter is immobile on the roadway or in a parking space.

In a fourth configuration, the electrical functionalization assembly can comprise one or more electrical outlets so as to connect thereto any types of electrical appliances.

In a fifth configuration, the electrical functionalization assembly can comprise any types of sensors, for example of temperature sensor type or of vehicle counting type.

In a sixth configuration, the electrical functionalization assembly can comprise one or more connection terminals for connecting to one or more wireless communication networks. It will be, for example, a terminal operating according to a known communication protocol such as WIFI, Bluetooth, 3G, 4G or other equivalent protocol. It will then involve proposing a slab provided with one or more of these communication functions.

In a seventh configuration, the electrical functionalization assembly can comprise a heating structure comprising, for example, resistors or a web making it possible to heat up the infrastructure, in particular to de-ice it in winter.

To address all of the desired functions, the covering slab 2 of the invention also comprises an electronic block 21 which includes at least one two-way solid-state current converter 210. Using this converter, depending on its function, the slab 2 will be able to act as current generator or as current receiver.

For an electrical functionalization assembly 20 with photovoltaic cells, the voltage converter will be of DC/AC type to convert the direct current supplied by the photovoltaic cells into alternating current.

For an electrical functionalization assembly 20 of electrical energy receiver type, the converter will be of a topology suited to the receiver block employed. For example, for an electronic signalling circuit, the voltage converter will be of AC/DC type, the electronic signalling circuit being connected on the DC side.

For an electrical functionalization assembly 20 having an induction-based electrical recharging module for an electric vehicle, the converter will be of AC/AC type.

For an electrical functionalization assembly 20 with heating structure, the voltage converter will be of AC/AC type.

Figure 3A:
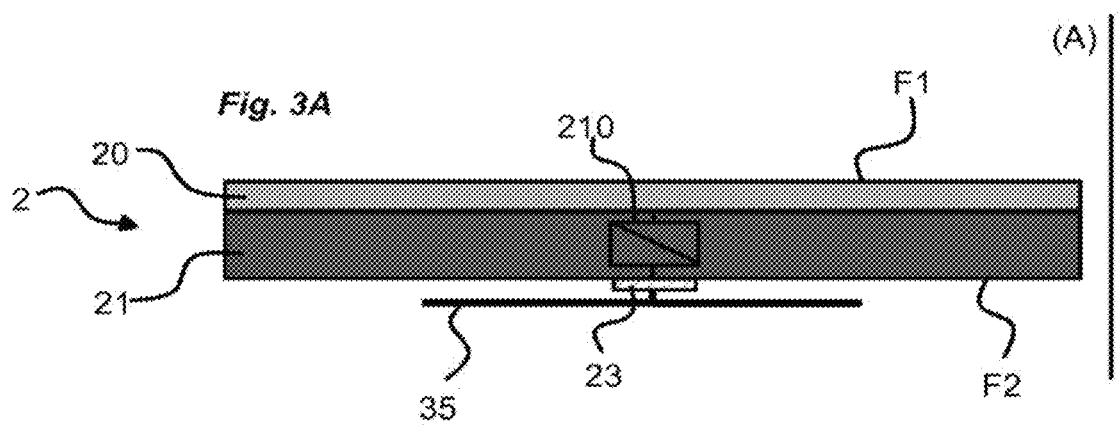

In order to make use of each covering slab as described above, several functionalized infrastructure wiring configurations are distinguished:
  a first configuration consists in electrically connecting each covering slab to another covering slab, by connections wired in series and/or in parallel (FIG. 3A);

a second configuration consists in providing each slab 2 with a contactless energy transmission block 22. For each covering slab, its contactless energy transmission block is intended to be inductively coupled with a corresponding block (FIG. 3B). The wiring is then set up between these latter blocks using a cable 35.

These two configurations are explained in more detail below.

In both configurations, each slab advantageously comprises an electrical connection block 23 connected to the electronic block 21.

In the first configuration, this electrical connection block 23 makes it possible to set up the interconnection by cable 35 of the slab with each adjacent slab.

In the second configuration, this electrical connection block 2 makes it possible to connect the contactless energy transmission block 2.

In the first configuration illustrated by FIG. 3A, the connection between the slabs is produced by wire. This solution will have to take into account the functionalization assembly of the slab, in generator or receiver mode. The slabs are in fact grouped by function. Those with photovoltaic function are for example connected only to one another, in series and/or in parallel. Obviously, several groups of slabs will be able to be produced.

The slabs will then be included in an overall electrical architecture comprising in particular at least, for example, one central electrical converter.

The electrical connection block 23 will be able to be wholly or partly incorporated in the electronic block 21 described above.

In the second configuration described above, the slab 2 thus comprises a contactless energy transmission block 22 which comprises an inductive coupler 220. As is known, this inductive coupler 220 comprises a winding of turns and is intended to be positioned facing a second inductive coupler to produce a contactless, that is to say wireless, transfer of electrical energy by electromagnetic coupling. One of the two couplers thus forms the primary of a transformer and the other of the two couplers forms the secondary of the transformer. Depending on the nature of the electrical functionalization assembly of the slab, the transfer of energy between the two couplers will be produced in one direction or in the other. If the electrical functionalization assembly comprises a current generator (for example a photovoltaic module), the transfer of energy will be produced from the inductive coupler of the slab to the second coupler. On the other hand, if the electrical functionalization assembly comprises one or more receivers (for example light-emitting diodes), the transfer of energy will be made in the other direction, that is to say from the second coupler to the coupler of the slab.

The arrangement of the inductive coupler 220 in the contactless energy transmission block 22 defines a coupling surface SC2 situated opposite the top face F1 of the slab and advantageously parallel to the bottom face F2.

The inductive coupler 220 comprises two terminals which are connected to the voltage converter 210 of the electronic block 21 described above.

The contactless energy transmission block 22 can be produced in the form of an independent element fixed onto the slab 2 or be incorporated in the electronic block described above. The block 22 can in particular comprise an independent housing enclosing the inductive coupler 220 or be housed in one and the same housing with the electronic block 21.

The winding forming the inductive coupler 220 can be produced in different configurations. It will be, for example, a coil of planar type whose plane defined by the coil defines the coupling surface described above. The winding of the planar coil is for example produced by screen printing on a printed circuit. One of the faces of the printed circuit then forms the coupling surface defined above.

From slabs produced according to this second configuration, the functionalized infrastructure has to have corresponding contactless energy transmission blocks to ensure the transfer of energy and thus to form a contactless energy transmission system in two parts. Such a contactless (in other words wireless) energy transmission system which includes one or more covering slabs 2 of the type described above is thus composed of two parts, a first part 3 and a second part, between which the contactless energy transmission takes place.

The second part of the system is formed by n covering slabs 2 as described above, n being greater than or equal to 1. In the case where the number n of slabs is greater than or equal to 2, all the covering slabs 2 employed in this second part of the system will be able to have an identical function, then offering the system a single functionality (for example slabs of photovoltaic type only), or different functions so as to offer the system several functionalities (for example a mix of slabs of photovoltaic type with light-signalling slabs).

Referring to FIGS. 4A and 4B, the first part 3 of the system comprises, for its part, n contactless energy transmission blocks 32, n being greater than or equal to 1. Each block 32 comprises an inductive coupler 320. Each inductive coupler 320 of this first part is intended to be associated with a distinct inductive coupler 220 of the second part. The inductive coupler 320 employed in the first part will advantageously comprise an architecture similar to that of the inductive coupler of the slab with which it is associated. It thus has a coupling surface SC1 intended to be positioned in parallel to the coupling surface SC2 of the slab so as to ensure a contactless transfer of energy. The characteristics of positioning between two windings to obtain the best possible contactless energy transfer efficiency are well known in the state of the art and are not therefore described in the present application. However, it can be noted that the positioning solution retained will be optimal on the axis x and the axis y and possibly variable in the third dimension (heightwise defined by the axis z).

The prior documents which relate in particular to the induction recharging solutions describe such characteristics.

To house each contactless energy transmission block 32, the first part 3 advantageously comprises one or more housings. Hereinafter in the description, it will be considered that each contactless energy transmission block has a structure in which the inductive coupler 320 is housed in a first housing 33 which comprises at least one wall defining an outer face, preferably planar, and an inner face with the coupling surface SC1 of the inductive coupler 320 of the block positioned facing it. This first housing will advantageously be hermetic and particularly strong to be employed in an infrastructure such as one of those described above.

Depending on the configuration of the system, the contactless energy transmission block 32 will be able to comprise a suitable solid-state converter 310 comprising two connection terminals between which the inductive coupler 320 is connected. This solid-state converter will be of AC/DC or AC/AC type, the inductive coupler being connected on the AC side. The block advantageously comprises a second housing 34, in which said solid-state converter 310 is housed. This second housing is fixed to the first housing.

The two housings are for example fixed to one another. The second housing extends under the first housing opposite the coupling surface. Electrical connection means are provided to ensure the electrical connection between the inductive coupler and the converter.

Obviously, in the contactless energy transmission block 32, any other arrangement of the inductive coupler and of the converter could be envisaged. The advantage of the implementation cited above lies in the easier thermal management of the solid-state converter in the coating, because it is distanced from the external thermal constraints.

Each contactless energy transmission block 32 of the first part 3 is electrically connected or included in an electrical architecture. This electrical architecture will be able to differ, in particular according to the types of slabs 2 employed.

The description below aims to explain the principle of production of a functionalized infrastructure which incorporates a contactless energy transmission system as described above.

Figure 5A:
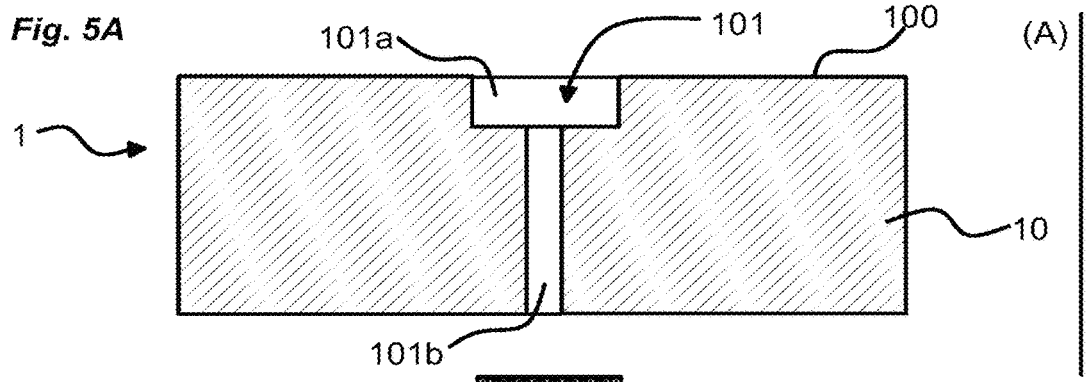
FIGS. 5A to 5D illustrate the main steps in implementing a functionalized infrastructure according to the invention.
Figure 5B:
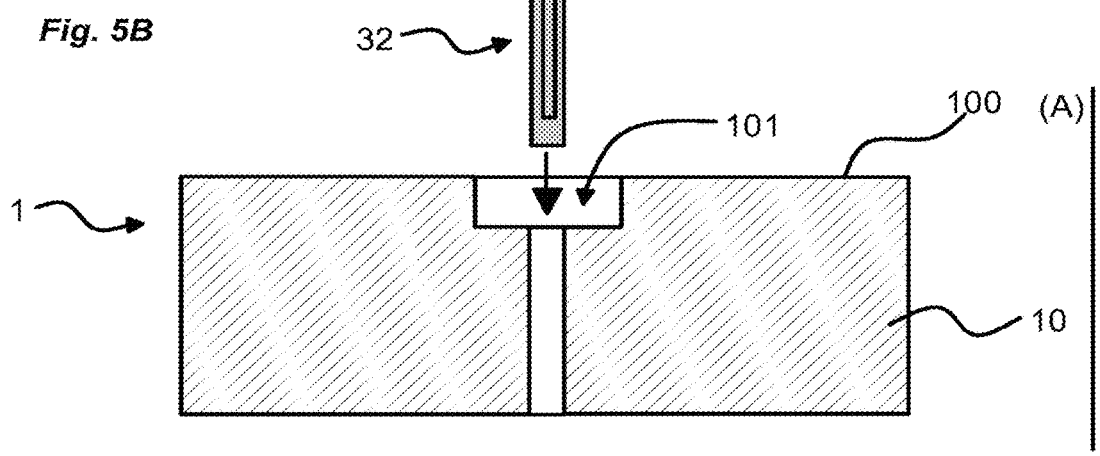

As already described above, an infrastructure such as a road comprises, for example, a bottom layer 10 provided with a surface 100 to be covered. According to the invention, this surface 100 to be covered is intended to be covered, at least partly, by the covering slabs 2 of the invention. Moreover, to house the first part 3 of the system, the solution of the invention consists in producing n cavities 101 or holes in the bottom layer 10 of the infrastructure, n being greater than or equal to 1 (FIG. 5A). Each cavity is intended to receive a contactless energy transmission block 32 of the first part of the system, each block 32 being positioned in the cavity so as to orient the coupling surface SC1 of its inductive coupler 320 upwards (FIG. 5B).

Advantageously, each cavity 101 is always produced with standard dimensions, that is to say depth, aperture section, form of said section.

Figure 5C:
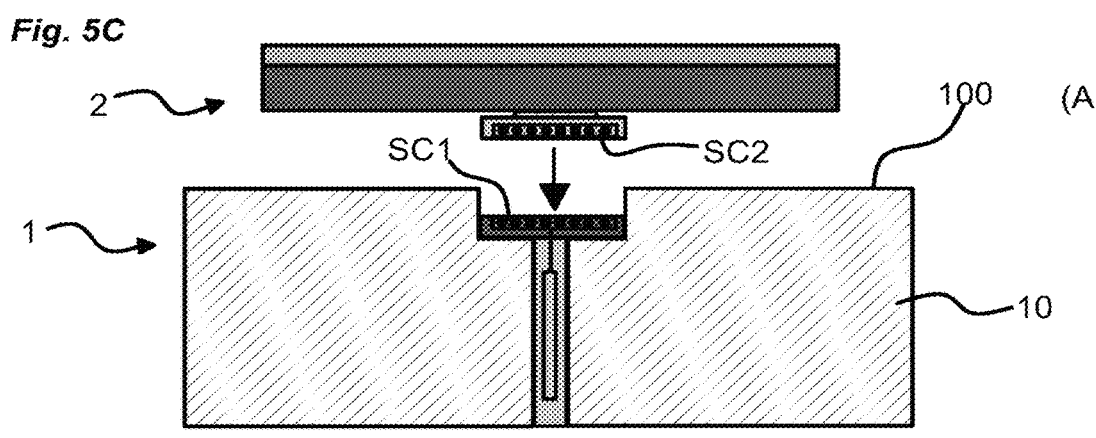
Figure 5D:
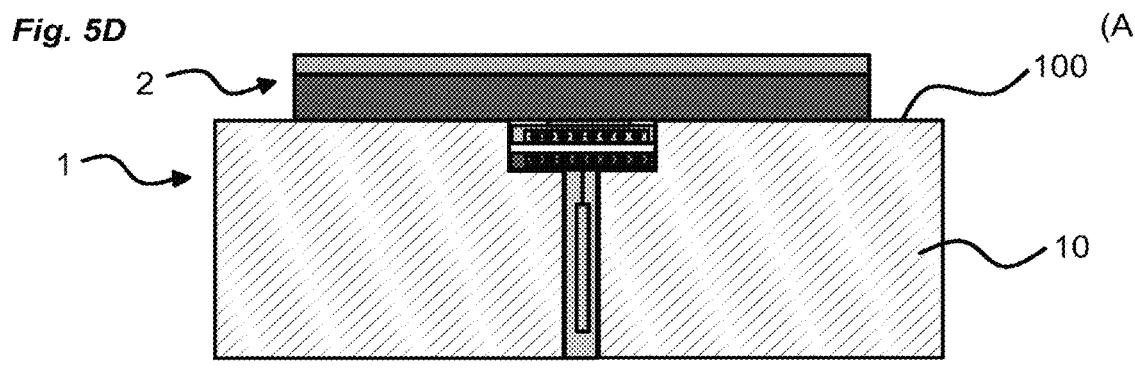

The aperture of the cavity 101 is then covered by a slab 2 (FIGS. 5C and 5D). Mechanical positioning and centring means are preferentially arranged to allow a perfect positioning and centring of the slab 2 relative to the cavity 101. This will for example involve producing the housing of the slab which encloses the inductive coupler with dimensions suitable for the latter to cooperate, with a minimal play, with the edge of the top aperture of the cavity.

The depth of each cavity is adapted for the coupling surface SC1 of the block 32 to be situated at a sufficient height to favour the energy transmission between the two couplers 220, 320.

In other words, it is essential for the two couplers 220, 320 to be arranged correctly facing one another on the axes x and y and observe a space between them on the axis z which is designed to guarantee a satisfactory coupling efficiency.

Referring to FIG. 5A, each cavity 101 has, for example, a form defining a top part 101*a* of constant section, extended by a bottom part 101*b* that is narrower than the top part and also of constant section. The bottom part of the cavity is intended to receive the second housing 34 of the contactless energy transmission block and the top part is intended to receive the first housing 33 of the contactless energy transmission block.

When the system comprises a first part with n energy transmission blocks and therefore n inductive couplers, with n greater than or equal to 2, the infrastructure is provided with n cavities of the type of that described above so as to each accommodate a distinct contactless energy transmission block 32.

Figure 6A:
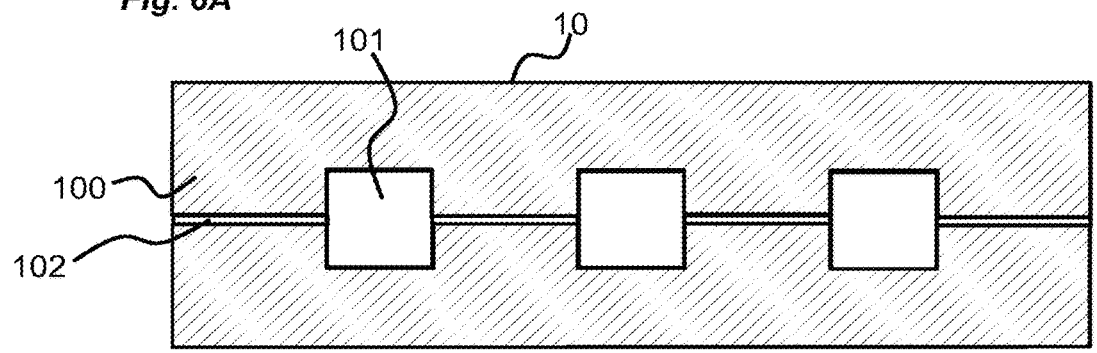
FIGS. 6A and 6B illustrate the principle of installation of the first part of the system of the invention.
Figure 6B:
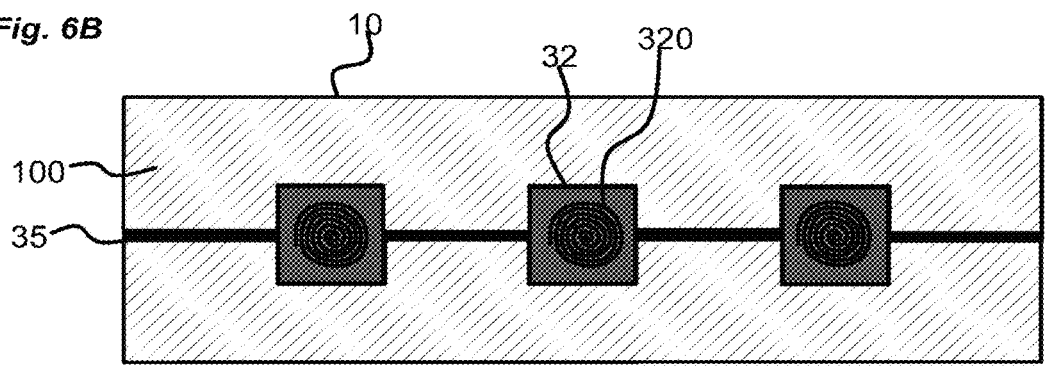

According to the invention, referring to FIGS. 6A and 6B, the infrastructure comprises a trench 102 produced in the bottom layer 10 and connecting each cavity 101 to an adjacent cavity.

According to the invention, in the system, each contactless energy transmission block 32 of the first part is thus connected to the adjacent block by at least one connecting cable 35, forming a kind of bus according to one of the electrical architectures presented above. And, each connecting cable 35 extends in a trench 102 connecting two cavities (FIG. 6B). The cable will be able to take any suitable form and will be connected from one block to another. It will for example be able to be a flexible ribbon cable.

By virtue of the architecture of the system and that of the infrastructure, the production of a functionalized infrastructure is simple. It in fact entails implementing the following steps:

Hollowing out several cavities 101 and several trenches, a trench connecting a cavity to an adjacent cavity. Each cavity 101 for example takes the form described above with two distinct superposed volumes so as to form a narrowing.

Positioning the first part 3 of the system such that each contactless energy transmission block 32 is positioned in a distinct cavity. The coupling surface SC1 of the block is positioned uppermost.

Positioning a covering slab above each cavity 101, so as to at least partially cover the surface 100 of the bottom layer 10, the coupling surface SC2 of the slab being positioned parallel to the surface SC1 and at a distance imposed by the mechanical positioning of the slab, this distance being adapted to allow a contactless energy transmission with the best possible efficiency.

Figure 7A:
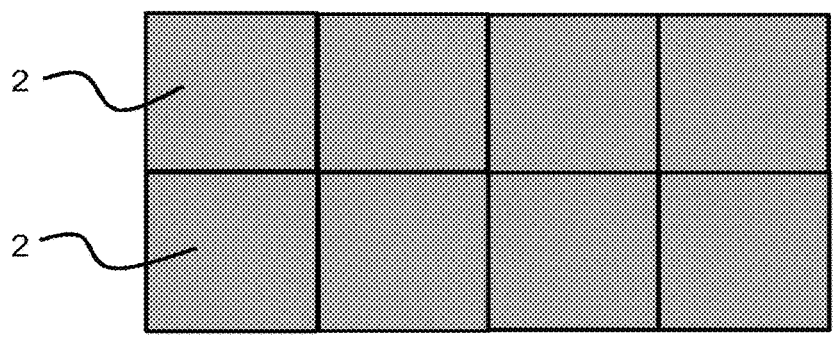
FIGS. 7A and 7B represent, seen from above and seen in transverse cross section, a functionalized infrastructure of road type provided with several adjacent slabs.
Figure 7B:
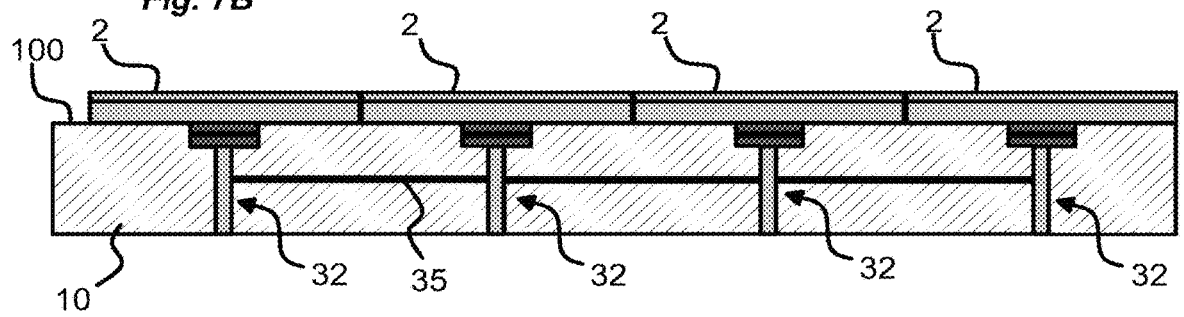

FIG. 7A thus shows a surface entirely covered with slabs 2 according to the invention. FIG. 7B shows, for its part, slabs positioned adjacent to one another on the surface 100 of the bottom layer 10. The outer surfaces of the n slabs positioned juxtaposed are arranged in one and the same plane, forming the plane of the roadway. The n slabs placed on the bottom layer are therefore fitted to one another, particularly in terms of dimensions, to be perfectly contiguous and thus maximize the paving of the surface to be covered of the bottom layer.

One of the benefits of producing a functionalized infrastructure which uses covering slabs as described above is to be able to propose slabs of standard form, allowing a rapid installation in particular. However, a standardization of the form of the slabs does present a difficulty as to the possibility of covering precisely all of a surface with juxtaposed and contiguous slabs since this surface to be covered can have an outline with curved portions.

Moreover, whatever the configuration employed, that is to say based on slabs connected directly to one another by wiring or using a contactless energy transmission solution as described above, it is advantageous to employ electrical connecting cables which are all globally of identical length. In other words, it is important for the electrical connection block of a slab to be separated from the electrical connection block of each adjacent slab by an identical rectilinear distance, in order to ensure a constant pitch and to allow a reproducibility of an electrical connection pattern from one slab to another.

Starting from these various constraints, the invention aims to propose a functionalized infrastructure in which:

the slabs are of at least two distinct forms while having the same functional architecture as described above in relation to the figures;

each slab is configured in such a way that its electrical connection block 23 is separated from the electrical connection block of an adjacent slab by a distance that is always the same (along a rectilinear path), that is to say by a constant pitch.

It is possible to imagine that the n juxtaposed slabs are each of a rank i, with i ranging from 1 to n. In relation to the slab of rank i−1 and to the slab of rank i+1, the slab of rank i is separated by the constant pitch P, said constant pitch P being able to correspond for example to a length of the cable pulled in a rectilinear direction between the two connection blocks of two juxtaposed slabs.

Thus, in the case of a contactless energy transmission system, the position of the electrical connection block on the slab makes it possible to set the position of the inductive coupler and thus to ensure that the latter is always positioned facing the inductive coupler of the first part of the system.

The form of the slab should be understood to mean the outline of its top face F1 thus determining the outer surface of the slab and therefore the one which covers a part of the surface of the bottom layer.

Figure 8:
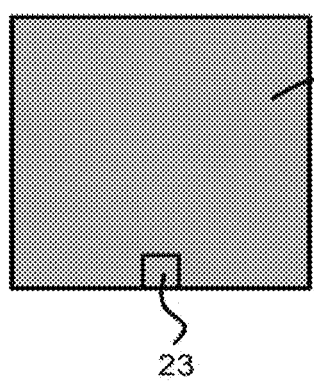
FIG. 8 represents, seen from above, a first type of slab that can be employed in the functionalized infrastructure of the invention.
Figure 9:
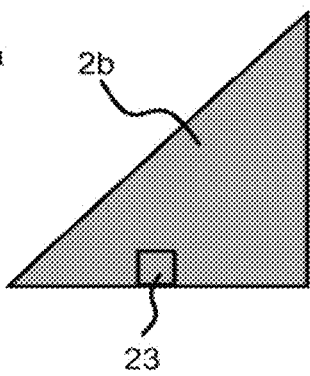
FIG. 9 represents, seen from above, a second type of slab that can be employed in the functionalized infrastructure of the invention.
Figure 9:
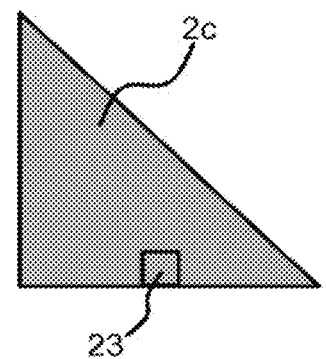

Advantageously, but in a nonlimiting manner, referring to FIGS. 8 and 9, there will thus be a first type of covering slab having a square form (reference 2a in the figures) and a second type of covering slab which has a triangular form (references 2b and 2c in the figures, according to the orientation of the triangle). The slab of second type is more particularly in the form of an isosceles right-angled triangle. In this slab, the two small sides are of a length equal to that of each side of the square formed by the slab of square form. It is thus understood that the slab of second type defines a surface equal to half that defined by the slab of first type.

According to the invention, the electrical connection block 23 already described above is included in the slab so as to ensure a constant pitch from one slab to another whatever the form of the slab. For the slab of square type, the electrical connection block 23 is advantageously positioned under the slab, on the bottom surface F2 of the slab, directly in line with the middle of one of the sides of the slab. For the slab of triangle type, the electrical connection block 23 is advantageously positioned under the slab, directly in line with the middle of one of the small sides of the triangle formed by the slab. For the slab of triangle form, as represented in FIG. 8, the electrical connection block 23 will be able to be positioned along one or other of the small sides of the triangle (slab configuration 2b or 2c in FIG. 8).

FIGS. 8 to 11 show, by transparency, the position of the electrical connection block under the slab.

Figure 10:
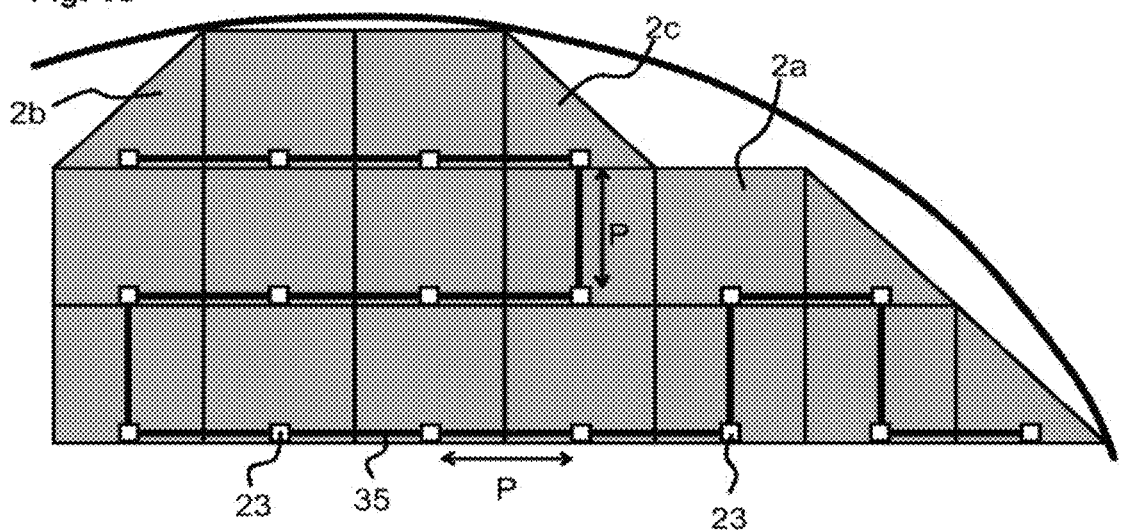
FIG. 10 schematically represents, seen from above, a functionalized infrastructure of the invention and illustrates the principle of connection with constant pitch between the slabs of this functionalized infrastructure.

FIG. 10 illustrates the principle of implementation of a constant pitch P between slabs of the abovementioned two forms to produce a functionalized infrastructure having a curved portion. In this FIG. 11, the infrastructure is formed by the juxtaposition of several slabs of square form 2a and of triangular slabs 2b or 2c, in order to best and maximally cover the surface 100 to be covered of the bottom layer 10. It should be understood that the infrastructure will be able to be produced by directly connecting the slabs according to the configuration presented in FIG. 3A or via the contactless solution according to the configuration represented in FIG. 3B. It will be noted in this figure that the position of the electrical connection block 23 makes it possible to keep the pitch P constant from one slab to another and in the two right-angled directions, in the plane of paving of the zone.

Figure 11:
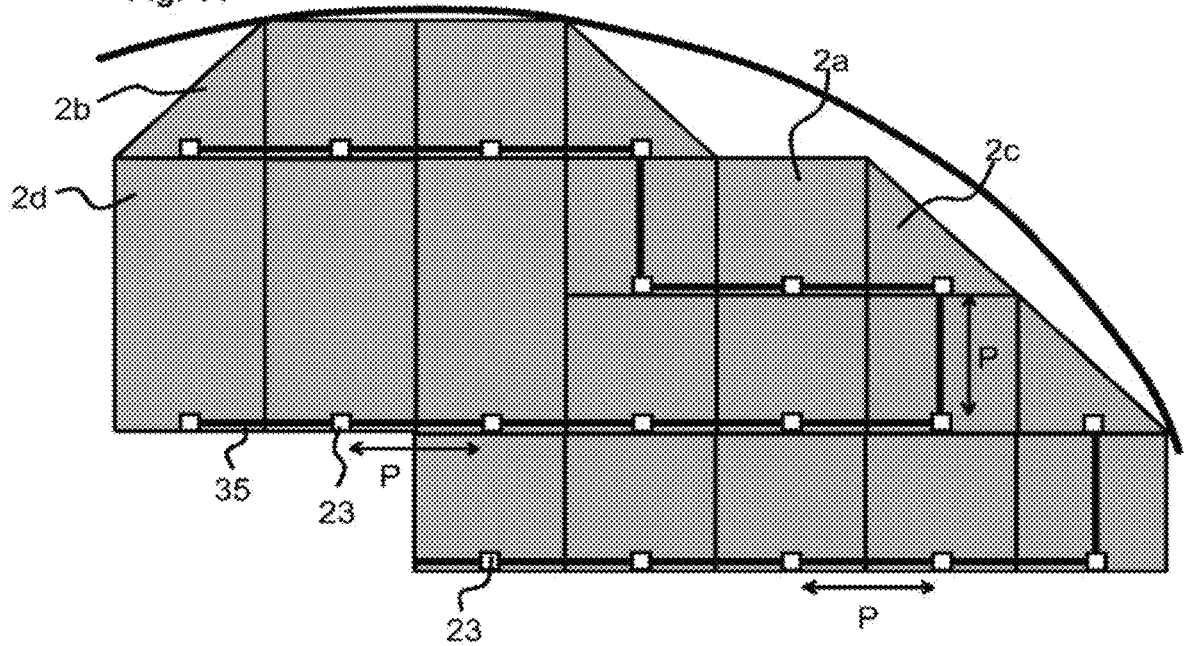
FIG. 11 illustrates a variant embodiment of the functionalized infrastructure of FIG. 10.

FIG. 11 represents a variant embodiment also employing slabs 2d of rectangular form. The rectangle formed by the slab would represent two juxtaposed square surfaces as described above. Likewise, the constant pitch P is maintained between the slabs in the two right-angled directions. It will be possible to consider that the constant pitch should at least be maintained in a first direction, particularly when the slabs are aligned juxtaposed in this first direction. The term "juxtaposed" should be understood to mean that the slabs are contiguous by one of their sides, the two contiguous sides being of equal lengths.

From FIG. 11, it will also be understood that it is possible to produce, in a same functionalized infrastructure, several series of slabs connected to one another by a pitch P that is constant from one to another. That is illustrated by FIG. 11 in which a first series of slabs connected to one another and a second series of slabs connected to one another can be seen. Distributing the slabs in multiple series makes it possible in particular to always keep the pitch constant from one slab to another whatever the form of the slab.

The invention thus offers a certain number of advantages, including:
Ease of production of a functionalized infrastructure, through the simple positioning of functionalized slabs.
A possibility of configuring the infrastructure by mixing several types of slabs, while retaining one and the same mode of installation.
An infrastructure that is easy to service, by virtue in particular of the possibility of replacing a defective slab easily, without having to involve all the infrastructure.
A standardization of the infrastructure, by employing slabs that have standard forms and that are connected to one another by electrical connections of lengths that are always identical by having obtained a constant pitch.

The invention claimed is:

1. A functionalized infrastructure comprising a bottom layer comprising a zone to be covered, said infrastructure further comprising:
n covering slabs, n being greater than or equal to 2, the n slabs each comprising a coverage surface for covering a part of said zone, the n slabs being arranged juxtaposed in order to pave said zone to be covered, each covering slab comprising at least one electrical functionalization assembly, and wherein:
the n covering slabs comprise at least one covering slab of a first type having a coverage surface of a first form and a covering slab of a second type having a coverage surface of a second form, distinct from the first form, and wherein,
each covering slab comprises an electrical connection block,
the electrical connection block of each slab is arranged on the slab so as to be separated from the electrical connection block of the adjacent slab by a pitch that is constant, whatever the form of each of their slabs.

2. The infrastructure according to claim 1, wherein said electrical connection block is arranged on each slab of rank i so as to generate a pitch that is constant in two right-angled directions.

3. The infrastructure according to claim 1, wherein said slab of the first type has a coverage surface of square form.

4. The infrastructure according to claim 3, wherein the electrical connection block is positioned along one of the sides of the square formed by the coverage surface.

5. The infrastructure according to claim 3, wherein said slab of second type has a coverage surface having an isosceles right-angled triangle form, of which each small side has a length equal to that of a side of the square formed by the coverage surface of the slab of first type.

6. The infrastructure according to claim 5, wherein the electrical connection block is arranged along one or other of the two small sides of the isosceles right-angled triangle formed by the coverage surface of the slab of second type.

7. The infrastructure according to claim 1, comprises a connecting cable arranged to connect the electrical connection block of each slab of rank i to the electrical connection block of the slab of rank i+1, said cable being of a length defining said constant pitch.

8. The infrastructure according to claim 1, wherein each slab comprises a contactless energy transmission block connected to said electrical connection block.

9. The infrastructure according to claim 8, comprises a contactless energy transmission system comprising a first part having n contactless energy transmission blocks and a second part formed by said n slabs, each contactless energy transmission block of the first part being positioned to be inductively coupled with a distinct corresponding contactless energy transmission block of the first part.

10. The infrastructure according to claim 9, comprises at least one connecting cable arranged to connect each contactless energy transmission block of the first part to an adjacent contactless energy transmission block of the first part, said connecting cable having a length corresponding to said constant pitch.

11. The infrastructure according to claim 1, wherein each slab comprises an electrical functionalization assembly of electrical energy generator type or of electrical energy receiver type.

12. A method for installing a functionalized infrastructure comprising a bottom layer comprising a zone to be covered, wherein said method comprises:
    covering said zone with n covering slabs arranged juxtaposed in order to pave said zone to be covered, each covering slab comprising a coverage surface positioned to cover a part of said zone and at least one electrical functionalization assembly, and wherein:
    the n covering slabs comprise at least one covering slab of a first type having a coverage surface of a first form and a covering slab of a second type having a coverage surface of a second form, distinct from the first form, and wherein,
    each covering slab comprises an electrical connection block,
    the electrical connection block of each slab is arranged on the slab so as to be separated from the electrical connection block of the adjacent slab by a pitch that is constant, whatever the form of each of their slabs.

13. The method according to claim 12, wherein said covering slab of first type has a coverage surface of square form.

14. The method according to claim 12, wherein said covering slab of second type has a coverage surface having an isosceles right-angled triangle form, of which each small side has a length equal to that of a side of the square formed by the coverage surface of the slab of first type.

15. The method according to claim 12, further comprising employing a connecting cable arranged to connect the electrical connection block of each slab of rank i to the electrical connection block of the slab of rank i+1, said cable being of a length defining said constant pitch.

16. The method according to claim 12, further comprising implementing a contactless energy transmission system between a first part having n contactless energy transmission blocks and a second part formed by said n covering slabs, each contactless energy transmission block of the first part being positioned to be inductively coupled with a distinct corresponding contactless energy transmission block of the first part and further comprising employing at least one connecting cable arranged to connect each contactless energy transmission block of the first part to an adjacent contactless energy transmission block of the first part, said connecting cable having a length corresponding to said constant pitch.

* * * * *